United States Patent
Quilici

(10) Patent No.: US 10,431,367 B2
(45) Date of Patent: *Oct. 1, 2019

(54) METHOD FOR GAPPING AN EMBEDDED MAGNETIC DEVICE

(71) Applicant: Radial Electronics, Inc., El Dorado Hills, CA (US)

(72) Inventor: James E. Quilici, El Dorado Hills, CA (US)

(73) Assignee: Radial Electronics, Inc., El Dorado Hills, CA (US)

( * ) Notice: Subject to any disclaimer, the term of this patent is extended or adjusted under 35 U.S.C. 154(b) by 335 days.

This patent is subject to a terminal disclaimer.

(21) Appl. No.: 15/168,185

(22) Filed: May 30, 2016

(65) Prior Publication Data

US 2016/0276086 A1 Sep. 22, 2016

Related U.S. Application Data

(60) Continuation-in-part of application No. 12/329,887, filed on Dec. 8, 2008, now Pat. No. 9,355,769, which
(Continued)

(51) Int. Cl.
*H01F 17/06* (2006.01)
*H01F 41/02* (2006.01)
(Continued)

(52) U.S. Cl.
CPC ............. *H01F 17/062* (2013.01); *H01F 3/14* (2013.01); *H01F 17/0033* (2013.01);
(Continued)

(58) Field of Classification Search
CPC .. H01F 41/02; H01F 41/0206; H01F 41/0226; H01F 41/041; H01F 41/042;
(Continued)

(56) References Cited

U.S. PATENT DOCUMENTS 3,638,156 A 1/1972 West
4,480,377 A * 11/1984 House ............... Y10T 29/49073
29/593

(Continued)

FOREIGN PATENT DOCUMENTS

EP 1122750 8/2001
EP 06815217.2 9/2006
(Continued)

OTHER PUBLICATIONS

PCT/US2009/052512, WO2011014200, publ. Mar. 2, 2011, International Search Report.
(Continued)

*Primary Examiner* — A. Dexter Tugbang
(74) *Attorney, Agent, or Firm* — Inventive Law Inc.; Jim H. Salter

(57) ABSTRACT

A method for gapping a magnetic component is disclosed. The method includes: forming a feature on a substrate, the feature being a depression defining an inside surface; disposing a first conductive pattern on the substrate and the inside surface of the feature; disposing a permeability material on the inside surface of the feature and the first conductive pattern; disposing a substrate material on the substrate and the feature; disposing a second conductive pattern on the substrate material to wrap the permeability material between the first conductive pattern and the second conductive pattern to define at least one electrical circuit to facilitate a magnetic field in the permeability material; and gapping the permeability material to remove at least a portion of the permeability material to produce a gap in the at least a portion of the permeability material.

16 Claims, 15 Drawing Sheets

Page 2

Related U.S. Application Data is a division of application No. 11/233,824, filed on Sep. 22, 2005, now Pat. No. 7,477,128.

(51) Int. Cl.

| | | |
|---|---|---|
| *H01F 41/04* | (2006.01) | |
| *H01F 17/00* | (2006.01) | |
| *H05K 1/02* | (2006.01) | |
| *H05K 1/16* | (2006.01) | |
| *H01F 41/064* | (2016.01) | |
| *H01F 3/14* | (2006.01) | |
| *H01F 27/28* | (2006.01) | |
| *H01F 27/02* | (2006.01) | |
| *H05K 1/14* | (2006.01) | |
| *H05K 3/00* | (2006.01) | |
| *H05K 3/20* | (2006.01) | |
| *H05K 3/46* | (2006.01) | |

(52) U.S. Cl.
CPC ..... *H01F 27/2804* (2013.01); *H01F 27/2895* (2013.01); *H01F 41/02* (2013.01); *H01F 41/0206* (2013.01); *H01F 41/0226* (2013.01); *H01F 41/041* (2013.01); *H01F 41/042* (2013.01); *H01F 41/046* (2013.01); *H01F 41/064* (2016.01); *H05K 1/0284* (2013.01); *H05K 1/165* (2013.01); *H01F 27/027* (2013.01); *H01F 2027/2814* (2013.01); *H05K 1/144* (2013.01); *H05K 3/0014* (2013.01); *H05K 3/20* (2013.01); *H05K 3/4611* (2013.01); *H05K 2201/0129* (2013.01); *H05K 2201/0141* (2013.01); *H05K 2201/086* (2013.01); *H05K 2201/09036* (2013.01); *H05K 2201/09045* (2013.01); *H05K 2201/09118* (2013.01); *H05K 2203/0139* (2013.01); *H05K 2203/0143* (2013.01); *H05K 2203/0292* (2013.01); *Y10T 29/4902* (2015.01); *Y10T 29/49078* (2015.01)

(58) Field of Classification Search
CPC .. H01F 41/064; H01F 17/0033; H01F 17/062; H01F 27/027; H01F 2027/2814; H01F 27/2804; H01F 27/2895; H01F 3/14; H01F 41/046; Y10T 156/10; Y10T 29/4902; Y10T 29/49073; Y10T 29/49075; Y10T 29/49078; H05K 3/0014; H05K 3/20; H05K 3/4611; H05K 2201/0129; H05K 2201/0141; H05K 2201/086; H05K 2201/09045; H05K 2201/09118; H05K 2201/09036; H05K 2203/0139; H05K 2203/0143; H05K 2203/0292; H05K 1/0284; H05K 1/144; H05K 1/165

See application file for complete search history.

(56) References Cited

U.S. PATENT DOCUMENTS

| | | |
|---|---|---|
| 5,372,967 A | 12/1994 | Sundaram et al. |
| 5,787,569 A | 8/1998 | Lotfi et al. |
| 5,942,963 A | 8/1999 | Reznik et al. |
| 5,959,846 A | 9/1999 | Noguchi et al. |
| 6,148,500 A | 11/2000 | Krone et al. |
| 6,181,130 B1 | 1/2001 | Norimitsu |
| 6,246,172 B1 * | 6/2001 | Bizen ................. H01F 41/0226 315/5.41 |
| 6,362,714 B1 | 3/2002 | Rice |
| 6,417,754 B1 | 7/2002 | Bernhardt |
| 6,535,085 B2 | 3/2003 | Song et al. |
| 6,686,824 B1 | 2/2004 | Yamamoto |
| 6,768,409 B2 | 7/2004 | Inoue et al. |
| 6,940,385 B2 | 9/2005 | Kusano |
| 6,990,729 B2 | 1/2006 | Pleskach et al. |
| 7,196,607 B2 | 3/2007 | Pleskach et al. |
| 7,477,128 B2 | 1/2009 | Quilici |
| 9,355,769 B2 | 5/2016 | Quilici |
| 2002/0047768 A1* | 4/2002 | Duffy ................. H01F 17/0033 336/145 |
| 2002/0057173 A1 | 5/2002 | Johnson |
| 2003/0005569 A1* | 1/2003 | Hiatt ................. H01F 17/0033 29/602.1 |
| 2003/0011041 A1 | 1/2003 | Acosta |
| 2004/0113738 A1 | 6/2004 | Ahn et al. |
| 2005/0122199 A1 | 6/2005 | Ahn et al. |
| 2007/0063807 A1* | 3/2007 | Quilici ................. H01F 41/041 336/223 |
| 2009/0077791 A1 | 3/2009 | Quilici |
| 2016/0086709 A1 | 3/2016 | Quilici |
| 2016/0093431 A1 | 3/2016 | Quilici |
| 2016/0111199 A1 | 4/2016 | Quilici |

FOREIGN PATENT DOCUMENTS

| | | |
|---|---|---|
| GB | 2271880 | 4/1994 |
| JP | 01287911 A | 11/1989 |
| JP | 2006210850 A * | 8/2006 |
| WO | WO2007038309 A3 | 5/2007 |
| WO | WO2011014200 A1 | 3/2011 |

OTHER PUBLICATIONS

PCT/US2009/052512, WO2011014200, publ. Mar. 2, 2011, International Preliminary Report on Patentability.
PCT/US2009/052512, WO2011014200, publ. Mar. 2, 2011, International Written Opinion.
PCT/US2006/037049, WO2007038309, publ. May 4, 2007, International Search Report.
PCT/US2006/037049, WO2007038309, publ. May 4, 2007, International Preliminary Report on Patentability.
PCT/US2006/037049, WO2007038309, publ. May 4, 2007, International Written Opinion.
European Supplemental Search Report, Appl. No. 06815217.2, filed Sep. 22, 2006, priority document PCT/US2006/037049, Report dated Oct. 4, 2015.

* cited by examiner (Section A-A)

(Section B-B)

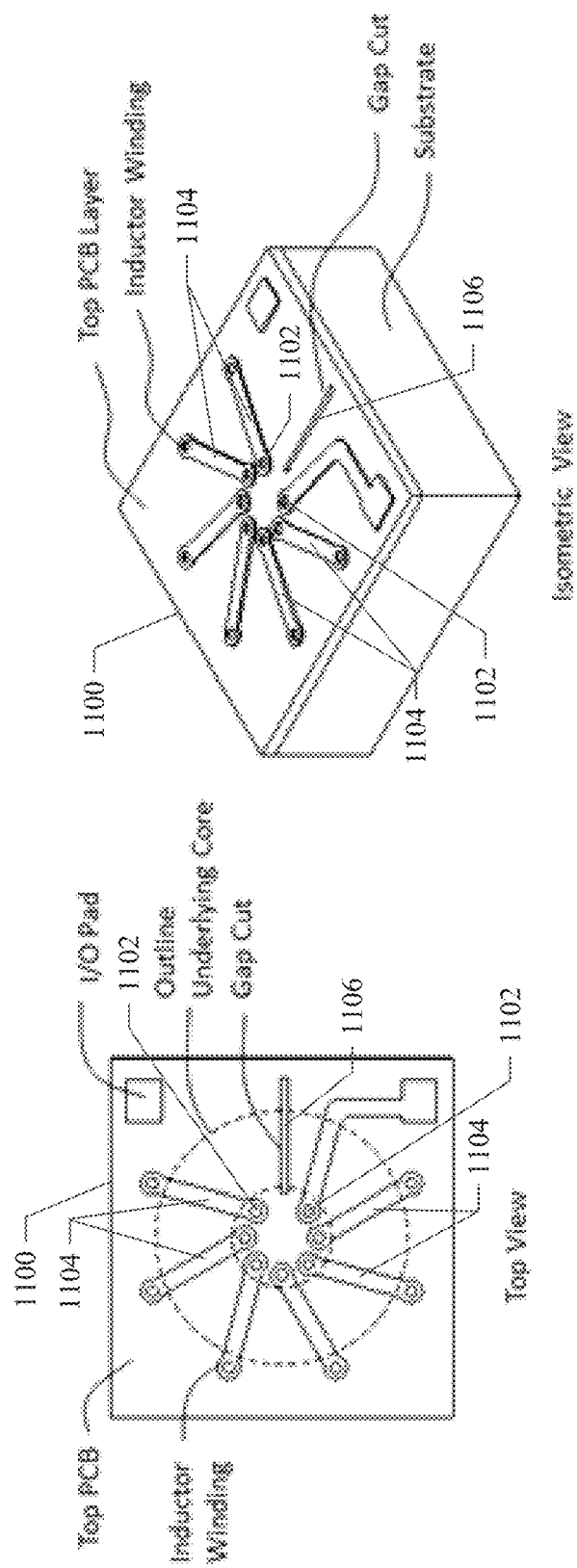

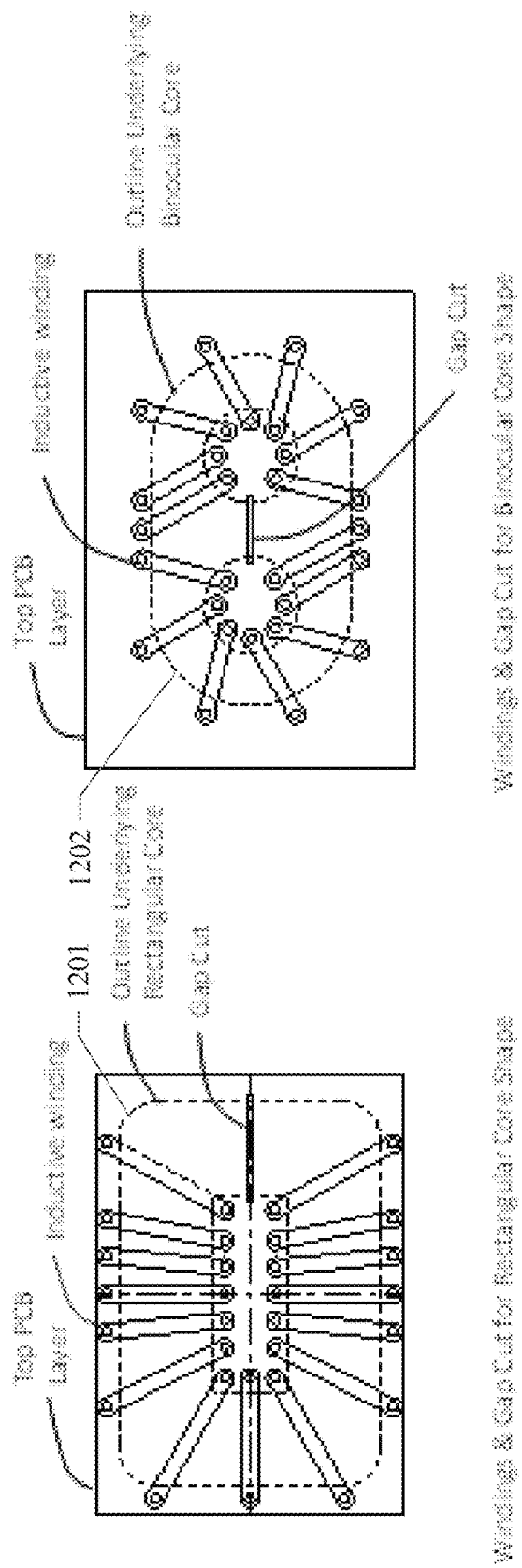

Active trimming and gapping

Method for Gapping an Embedded Magnetic Device
-1700-

↓

Form a feature on a substrate, the feature being a depression defining an inside surface.
-1710-

↓

Dispose a first conductive pattern on the substrate and the inside surface of the feature.
-1720-

↓

Dispose a permeability material on the inside surface of the feature and the first conductive pattern.
-1730-

↓

Dispose a substrate material on the substrate and the feature.
-1740-

↓

Dispose a second conductive pattern on the substrate material, the second conductive pattern substantially matching the first conductive pattern to wrap the permeability material between the first conductive pattern and the second conductive pattern producing a winding type structure electrically coupling the first conductive pattern and the second conductive pattern in electrical connection to define at least one electrical circuit to facilitate a magnetic field in the permeability material.
-1750-

↓

Gap the permeability material to remove at least a portion of the permeability material to produce a gap in the at least a portion of the permeability material.
-1760-

↓

End

Fig. 17

METHOD FOR GAPPING AN EMBEDDED MAGNETIC DEVICE

PRIORITY APPLICATIONS

This is a continuation-in-part patent application claiming priority to U.S. patent application Ser. No. 12/329,887, filed on Dec. 8, 2008, which is a divisional application claiming priority to U.S. non-provisional patent application Ser. No. 11/233,824, filed on Sep. 22, 2005, which are in their entirety incorporated herewith by reference.

BACKGROUND

The disclosure generally relates to magnetic components.

A wide range of electronic devices may have various magnetic components. Magnetic components may be capable of providing various functions. For example, magnetic components in electronic devices may function as transformers, inductors, filters, and so forth. Commonly, in order to have magnetic properties, magnetic components may comprise of an assembly of one or more wires wound around a material having permeability properties such as ferromagnetic material having a toroidal type shape, a rod type shape, etc. When a current is applied to the one or more wires, the component may produce a magnetic field, which may be utilized to address a wide range of electrical needs associated with electronic devices.

BRIEF DESCRIPTION OF THE DRAWINGS

Embodiments are illustrated by way of example and not by way of limitation in the figures of the accompanying drawings, in which like references may indicate similar elements and in which:

FIGS. 11a and 11b show a top view and isometric view of an embedded magnetic inductor in an example embodiment;

FIGS. 12a and 12b show examples of embedded magnetic devices implemented on rectangular and multi-hole (binocular) core structures;

FIG. 17 is a flow chart illustrating an example embodiment of a method as described herein.

DETAILED DESCRIPTION

In the following description, embodiments will be disclosed. For purposes of explanation, specific numbers, materials, and/or configurations are set forth in order to provide a thorough understanding of the embodiments. However, it will also be apparent to those skilled in the art that the embodiments may be practiced without one or more of the specific details, or with other approaches, materials, components, etc. In other instances, well-known structures, materials, and/or operations are not shown and/or described in detail to avoid obscuring the embodiments. Accordingly, in some instances, features are omitted and/or simplified in order to not obscure the disclosed embodiments. Furthermore, it is understood that the embodiments shown in the figures are illustrative representations and are not necessarily drawn to scale.

References throughout this specification to "one embodiment" or "an embodiment" means that a particular feature, structure, material, and/or characteristic described in connection with the embodiment is included in at least one embodiment. Thus, the appearances of the phrases "in one embodiment" and/or "in an embodiment" in various places throughout this specification are not necessarily all referring to the same embodiment. Furthermore, the particular features, structures, materials, and/or characteristics may be combined in any suitable manner in one or more embodiments.

For the purposes of the subject matter disclosed herein, substrates may include a wide range of substrates such as, but not limited to, plastic type substrates, semiconductor type substrates, and other insulating material substrates, including polyimide, fiberglass, and ceramic. Accordingly, it should appreciated by those skilled in the art that types of substrates may vary widely based at least in part on its application. However, for the purposes of describing the subject matter, references may be made to a substrate along with some example types, but the subject matter is not limited to a type of substrate. Additionally, for the purposes of describing various embodiments, references may be made to magnetic components. However, it should be appreciated by those skilled in the relevant art that magnetic components may include a wide variety of magnetic components such as, but not limited to transformer type components, inductor type components, filter type components, and so forth, and accordingly, the claimed subject matter is not limited in scope in these respects.

Figure 1:
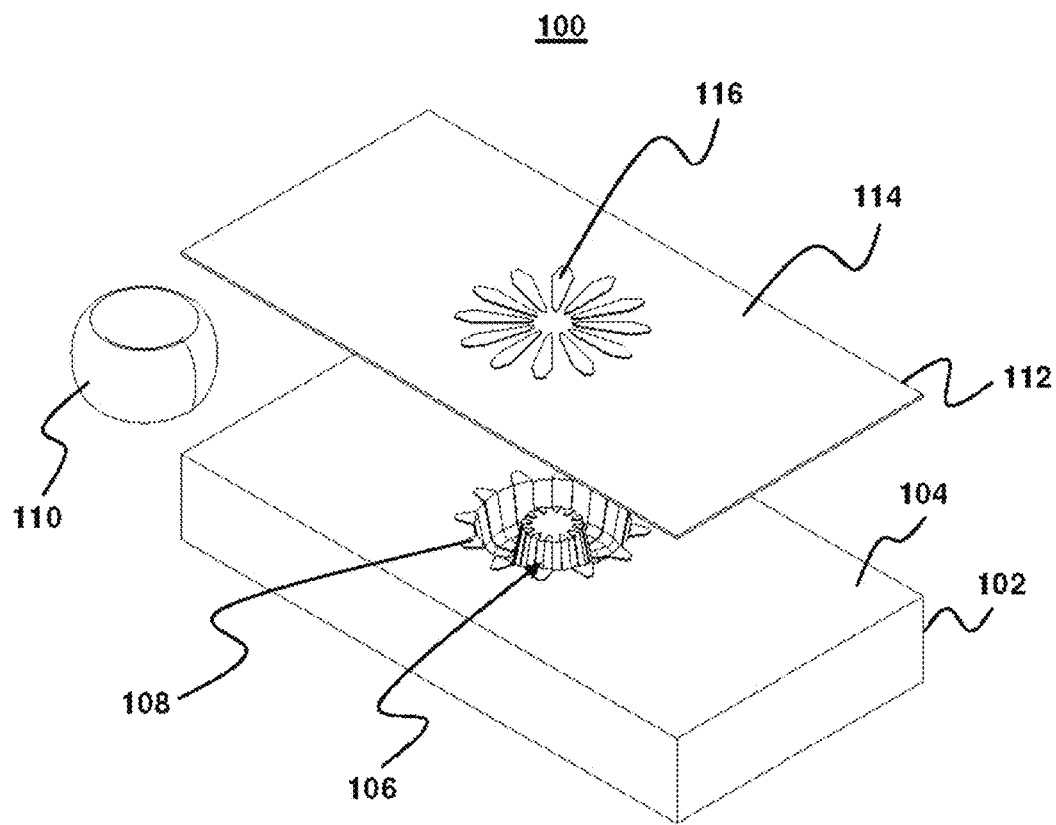
FIG. 1 illustrates a perspective exploded view of a magnetic component in accordance with one embodiment.

Turning now to the figures, FIG. 1 illustrates a perspective exploded view of a magnetic component in accordance with one embodiment. As shown in FIG. 1, magnetic component 100 may comprise of a substrate 102 having a first surface 104 and a feature 106. A first conductive pattern 108 may be disposed on the feature 106. A permeability material 110 may be disposed within the feature 106. Additionally, in the illustrated embodiment, a substrate material 112 may be disposed on the first surface 104 and on the feature 106, thereby forming a second surface 114. Disposed on the second surface 114 may be a second conductive pattern 116. As will be further described in detail, first conductive pattern 108 and second conductive pattern 116 cooperate to be capable of facilitating magnetic properties of permeability material 110 in accordance with various embodiments.

It should be appreciated that FIG. 1 illustrates an exploded view to describe an embodiment of the claimed subject matter, and accordingly, as will be described in further detail, magnetic component 100 may have permeability material 110 substantially enclosed within feature 106 with substrate material 112 substantially covering the permeability material 110. First conductive pattern 106 and second conductive pattern 116 may substantially surround the permeability material, thereby forming a winding type relationship.

Continuing to refer to FIG. 1, substrate 102 is shown having a substantially rectangular type shape. However, it should be appreciated that substrate 102 may have any type of shape such as, but not limited to, substantially circular, substantially square, or any other type of polygonal shape. Additionally, substrate 102 may comprise of many types of material such as, but not limited to, material suitable for printed circuit boards (PCBs), various plastic type materials, material suitable for injection molding and so forth. For example, in one embodiment, substrate 102 may comprise of a thermoplastic type material such as, but not limited to, polyetherimide (PEI) type material. In another embodiment, substrate 102 may comprise of a resin type material that may be suitable for injection type molding such as, but not limited to, liquid crystal polymer type material. It should be appreciated by those skilled in the relevant art that the shape and materials described are merely examples, and the claimed subject matter is not limited in scope in these respects.

In FIG. 1, feature 106 is illustrated as a cup type feature below the first surface 104. That is, feature 106 may comprise of a depression in the first surface 104 of substrate 102. Further, in the illustrated embodiment of FIG. 1, feature 106 may comprise of a toroidal type shape depression below first surface 104 into the body of substrate 102. However, it should be appreciated by those skilled in the relevant art that feature 106 may have a wide range of shapes such as, but not limited to, a rod type shape, oblong type shape, and so forth, and accordingly, the claimed subject matter is not limited in scope in these respects.

A variety of approaches may be utilized in order to facilitate formation of feature 106. For example, in one embodiment, feature 106 may be formed by utilizing a lithography type process such as, but not limited to photolithography. In another embodiment, feature 106 may be formed by utilizing a machining type process such as, but not limited to, a micromachining process. Various approaches may be utilized to facilitate formation of a feature, and accordingly, the claimed subject matter is not limited to a particular approach.

As shown in FIG. 1, first conductive pattern 108 may be disposed in a pattern around the inside of feature 106. In the illustrated embodiment, first conductive pattern 108 may be disposed in a manner whereby first conductive pattern 108 substantially lines portions of the inside surfaces of the feature 106. Here too, a variety of approaches may be utilized in order to dispose the first conductive pattern 108. In one embodiment, first conductive pattern 108 may be disposed by utilizing a stamping type approach such as, but not limited to, stamping a conductive pattern on a substrate.

In another embodiment, first conductive pattern 108 may be disposed by utilizing a plating type approach such as, but not limited to, chemical and/or electroplating a conductive pattern on a substrate. In another embodiment, first conductive pattern 108 may be disposed by utilizing a lithography type approach such as, but not limited to, photolithography. In yet another embodiment, a structuring type approach such as, but not limited to, laser structuring type approach may be utilized to dispose first conductive pattern 108. Various approaches may be utilized to dispose a conductive pattern, and accordingly, the claimed subject matter is not limited to a particular approach.

First conductive pattern 108 may comprise of a wide variety of materials such as, but not limited to, copper, aluminum, gold, and various types of conductive tracing materials. Accordingly, the claimed subject matter is not limited in scope in these respects. Continuing to refer to FIG. 1, permeability material 110 is shown as having a shape based at least in part on the shape of the feature 106. That is, permeability material 110 may have a substantially toroidal shape that may substantially fit within the feature 106. In the embodiment of FIG. 1, permeability material 110 may be shown as a separate solid object, where the solid object may be placed within the feature 106 by various methods such as, but not limited to, utilizing a pick and place machine. However, in another embodiment, permeability material 110 may be of a liquid type form whereby the liquid type form may be poured into a feature. In another embodiment, permeability material 110 may be in the form of a powder type material whereby the powder type material may be disposed into a feature. In yet another embodiment, permeability material 110 may comprise of material that may be utilized with a vibration based type approach to facilitate placement of the permeability material substantially within the feature 106. That is, a method by which a vibration type machine may be utilized. Accordingly, the claimed subject matter is not limited in scope in these respects.

Permeability material 110 may comprise of a wide variety of materials such as, but not limited to, ferromagnetic type materials that may include ferrite type materials, iron type material, metal type materials, metal alloy type materials, and so forth. Additionally, permeability material 110 may comprise of materials based at least in part on the particular utilization of a magnetic component. For example, a magnetic component to be utilized as an isolation transformer may include a permeability material having a relatively high permeability, such as, but not limited to 10000 Henry per meter. In another example, a magnetic component to be utilized as a common mode filter may include a permeability material having a moderate permeability such as, but not limited to, 1000 Henry per meter. Further, as previously alluded to, the size and shape of the permeability material 110 may be based at least in part on the utilization of the magnetic component as well. Accordingly, the claimed subject matter is not limited in scope in these respects.

In FIG. 1, for the purposes of describing the embodiment, substrate material 112 may be shown as a thin layer. However, the thin layer may be representative of one or more layers of printed circuit layers to be disposed on the first surface 104 of the substrate 102 and does not necessarily denote a single piece of substrate material, but it also could be a single piece of substrate material. Additionally, the substrate material 112 does not necessarily need to substantially match the material of the substrate 102 and may be of a different material. For example, in one embodiment, the substrate material 112 may include various lamination layers that facilitate a build-up of circuit layers. In another embodiment, a liquid type material may be disposed on the on a substrate such as, but not limited to, a liquid dielectric type material. For example, a liquid type dielectric type material may be disposed by utilizing at least one of a spray type, roller type, and/or a squeegee type approach. It should be appreciated by those skilled in the relevant art that the substrate material 112 may be disposed on the first surface 104 of the substrate 102 by a wide variety of approaches. Accordingly, the claimed subject matter is not limited to any one particular approach.

In the embodiment illustrated in FIG. 1, second conductive pattern 116 is shown on the second surface 114 of substrate material 112. However, as previously described, second conductive pattern 116 may be disposed on the substrate material 112 utilizing a variety of approaches such as, but not limited to, a lamination approach, lithography approach, etching approach, a screen printing type approach, a laser structuring type approach, and so forth. That is, second conductive pattern 116 may be disposed as part of the process of providing substrate material 112, and accordingly, the claimed subject matter is not limited in these respects.

In the embodiment of FIG. 1, second conductive pattern 116 substantially matches the pattern of the first conductive pattern 108 to facilitate wrapping of the permeability material 110 between the first conductive pattern 108 and the second conductive pattern 116. Additionally, first conductive pattern 108 and second conductive pattern 116 may be electrically coupled by various vias and/or interconnects as will be described in detail herein. Moreover, plated through hole (PTH) vias can be used to interconnect the layers with conductive patterns on the top and bottom surfaces. Techniques for implementing PTH vias are well known to those of ordinary skill in the art. Together, first conductive pattern 108 and the second conductive pattern 116 cooperate to be capable of facilitating magnetic properties of the permeability material 110. For example, first conductive pattern 108 and second conductive pattern 116 may cooperate to be capable of inducing a magnetic field upon the permeability material 110.

Figure 2A:
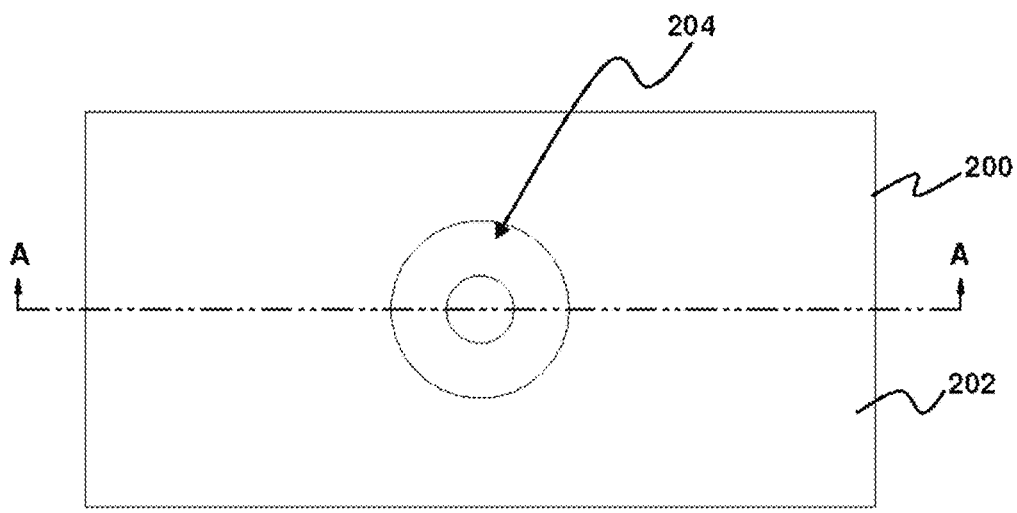
FIGS. 2A-2B illustrate a top view and a sectional view of a substrate having a feature in accordance with one embodiment.
Figure 2B:
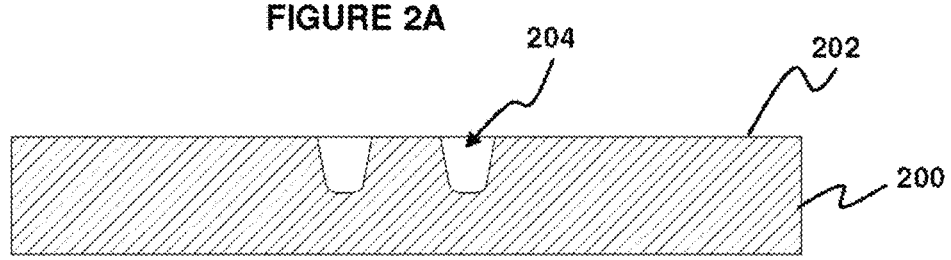

FIGS. 2A-2B illustrate a top view and a sectional view of a substrate having a feature in accordance with one embodiment. In FIG. 2A, a substrate 200 may have a surface 202 and a feature 204. As shown in FIG. 2B, feature 204 may be formed into the substrate 204 below the surface 202. In this embodiment, the feature 204 may have a substantially toroidal shape formed as a depression type feature into the substrate 200. As previously described, feature 204 may be formed by utilizing a wide variety of approaches and may have a variety of shapes, and accordingly, the claimed subject matter is not limited in these respects.

Figure 3A:
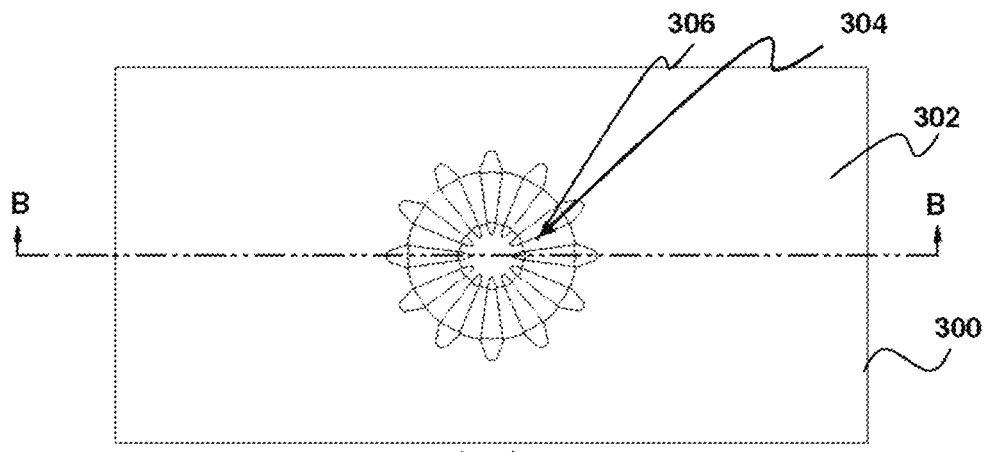
FIGS. 3A-3C illustrate a top view, a section view, and a detail view of a substrate having a feature and a conductive pattern disposed within the feature in accordance with one embodiment.
Figure 3B:
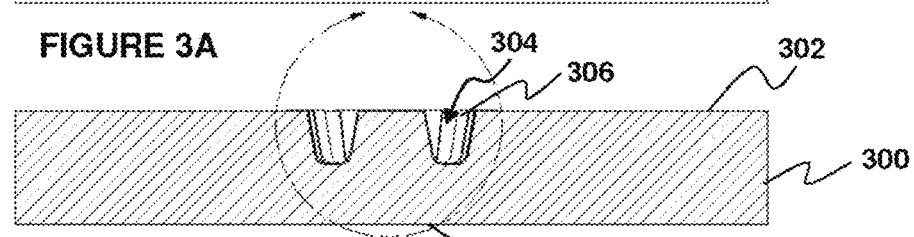
Figure 3C:
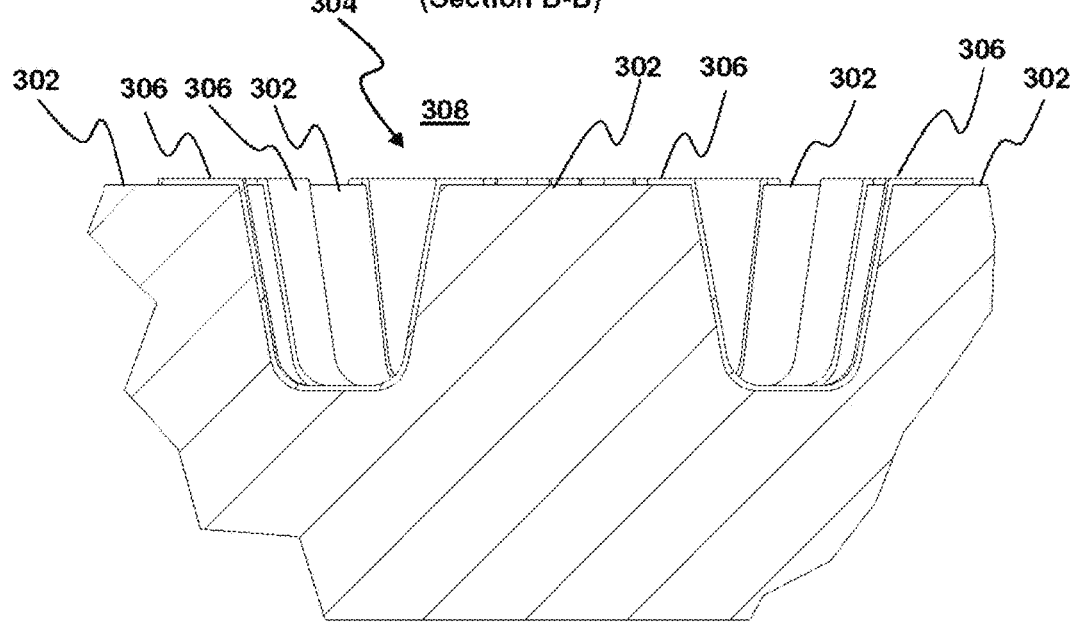

FIGS. 3A-3C illustrate a top view, a section view, and a detail view of a substrate having a feature and a conductive pattern disposed within the feature in accordance with one embodiment. Referring to FIG. 3A, a substrate 300 may have a surface 302, a feature 304, and a conductive pattern 306. As shown in FIG. 3A, feature 304 may have a substantially toroidal type shape, and correspondingly, conductive pattern 306 may be patterned circumferentially around the feature 304 (i.e., a wheel type pattern radiating from the center of the toroid). Turning to FIG. 3B, in the illustrated embodiment, conductive pattern 306 has a portion on the surface 302 and partly covers the walls of the feature 304 (i.e., feature areas below surface 302). Detail 308 is illustrated in FIG. 3C, where conductive pattern 306 is shown provided on surface 302, inside feature 304, and back on surface 302.

As previously described, once the conductive pattern 306 is disposed on the feature 304, a permeability material may be disposed within the feature 304. A substrate material may be disposed on the surface 302 having a second conductive pattern. Various conductive paths such as, but not limited to, vias and/or interconnects (not shown) may be formed and utilized to electrically couple the two conductive patterns, thereby forming a winding type structure around a permeability material.

Figure 4:
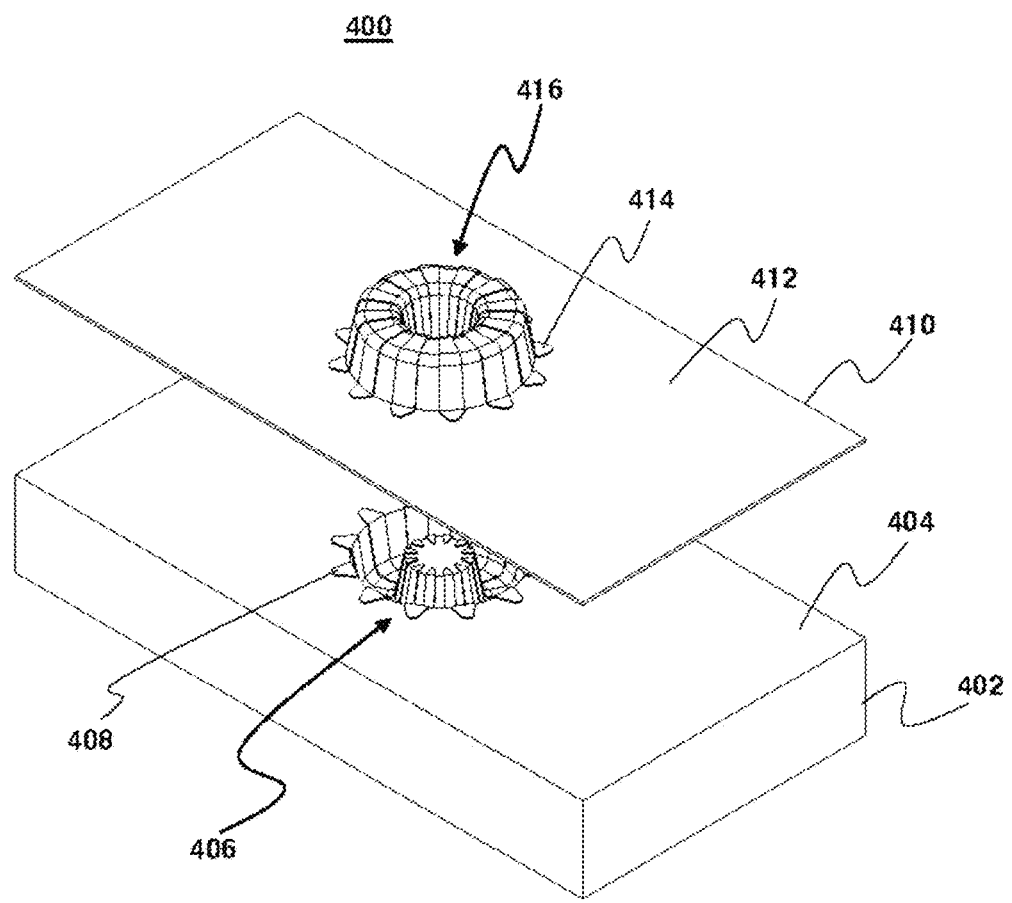
FIG. 4 illustrates a perspective exploded view of a magnetic component in accordance with another embodiment.

FIG. 4 illustrates a perspective exploded view of a magnetic component in accordance with another embodiment. In FIG. 4, similar to magnetic component 100 (shown in FIG. 1), magnetic component 400 may include a substrate 400, a first surface 404, a feature 406, a first conductive pattern 408, a substrate material 410, a second surface 412, and a second conductive pattern 414. However, in this embodiment, a permeability material (not shown) may be relatively large based at least in part on its application. Accordingly, a second feature 416 may be formed on the substrate material 410 to facilitate accommodation of the permeability material. As shown, second conductive pattern 414 may be disposed to at least partially cover the surfaces of the second feature 416. As previously described, substrate material 410 may be disposed on the substrate utilizing various approaches such as, but not limited to, a lamination type approach, where a sheet of substrate material having a second feature may be disposed on a substrate. Alternatively, substrate material may be disposed utilizing an etching type approach, where the second feature 416 may be the result of covering the permeability material that extends out of the surface 404. Further, substrate material may be disposed utilizing a spray type, roller type, and/or a squeegee type approach. Accordingly, the claimed subject matter is not limited to a particular approach.

Here again, various approaches may be utilized for disposing conductive patterns. For example, one such approach may be a lithography type approach utilizing various etching methods, and another approach may be to utilize a stamping type approach, a laser structuring type approach, and so forth. Conductive patterns may be patterned to facilitate various magnetic properties for various magnetic components based at least in part on their applications. Further, because an approach that may be utilized in providing the number of conductive patterns may be of a lithography type approach, laser structuring type approach, etc., precision of the conductive patterns may be relatively high based at least in part on the type approaches utilized such as, but not limited to, a high aspect lithography approach of ultraviolet photolithography, and accordingly, the claimed subject matter is not limited to a particular approach.

In various embodiments, one or more magnetic components may be formed on a single substrate. Additionally, because the magnetic properties of a magnetic component may be based at least in part on its conductive pattern, its feature size, permeability material utilized, and/or so forth, more than a single type of magnetic component may be formed from a single substrate, and accordingly, the claimed subject matter is not limited in these respects.

Examples of magnetic components may include a magnetic component including a substrate having a feature, a first conductive pattern, a permeability material, a substrate material, and a second conductive pattern, where the first conductive pattern and the second conductive pattern cooperate to be capable of facilitating magnetic properties of the permeability material for various applications. Various applications may include applications such as, but not limited to a dual common mode filter, a single common mode filter, a single inductor, an isolation transformer, and so forth, and accordingly, the claimed subject matter is not limited in these respects. Various embodiments of various magnetic components, without limitations, may be illustrated in FIG. 5 through FIG. 8.

Figure 5:
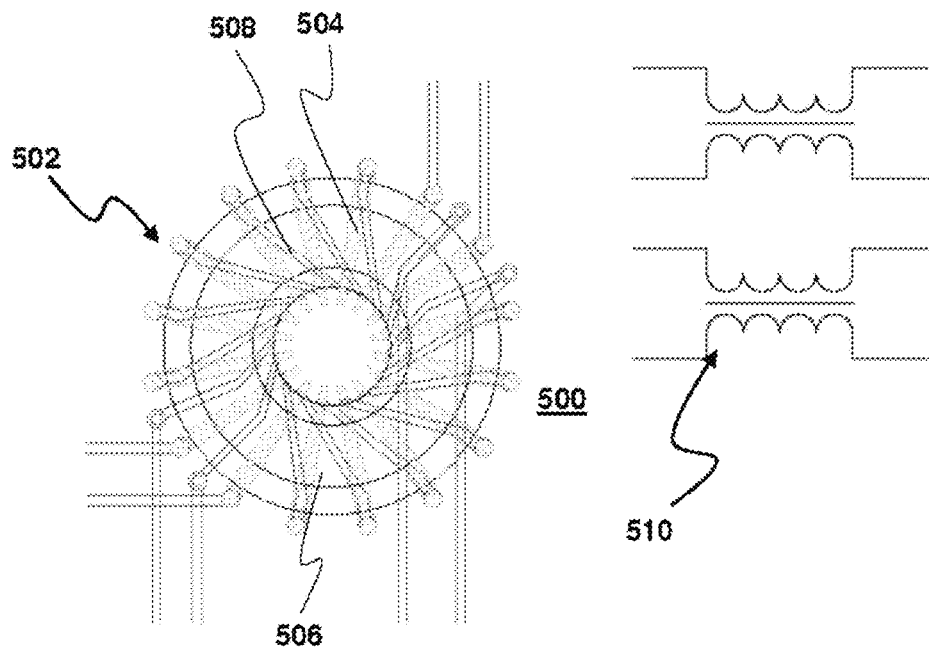
FIG. 5 illustrates a schematic of a magnetic component in accordance with an embodiment.

Turning now to FIG. 5, a magnetic component 500 may include a substrate (not shown) having a feature 502, a first conductive pattern 504, a permeability material 506, a substrate material (not shown), and a second conductive pattern 508. The first conductive pattern 504 and the second conductive pattern 508 cooperate to be capable of facilitating magnetic properties of the permeability material 506, and in this particular embodiment, magnetic component 500 may be capable of being utilized as a dual common mode filter (i.e., a common mode filter type functionality) as shown by related circuit illustration 510. It should be appreciated that the substrate and substrate material are not shown in order to better illustrate the embodiment.

Figure 6:
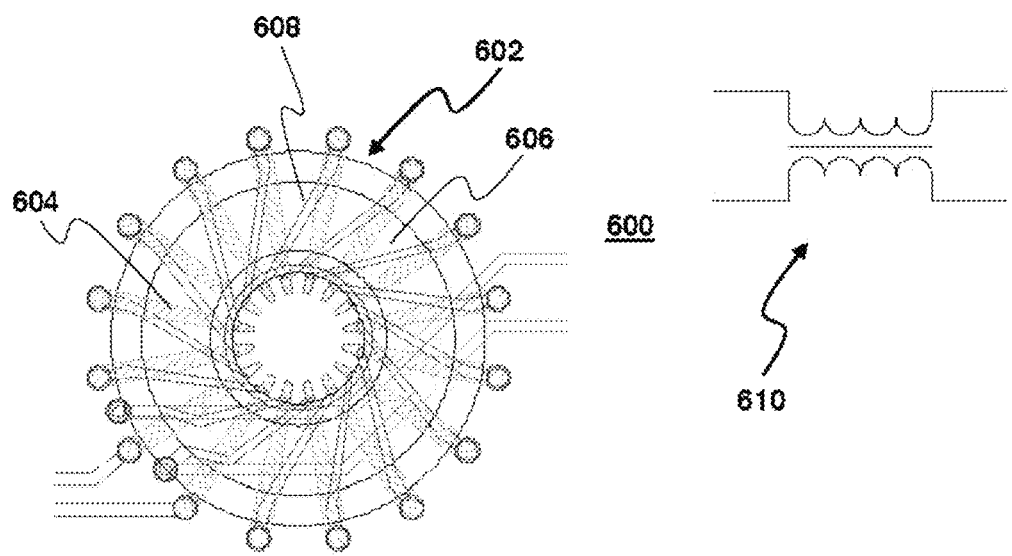
FIG. 6 illustrates a schematic of a magnetic component in accordance with another embodiment.

FIG. 6 illustrates a schematic of a magnetic component in accordance with another embodiment. In FIG. 6, magnetic component 600 may include a substrate (not shown) having a feature 602, a first conductive pattern 604, a permeability material 606, a substrate material (not shown), and a second conductive pattern 608. The first conductive pattern 604 and the second conductive pattern 608 cooperate to be capable of facilitating magnetic properties of the permeability material 606, and in this particular embodiment, magnetic component 600 may be capable of being utilized as a single common mode filter (i.e., a single common mode filter functionality) as shown by related circuit illustration 610.

Figure 7:
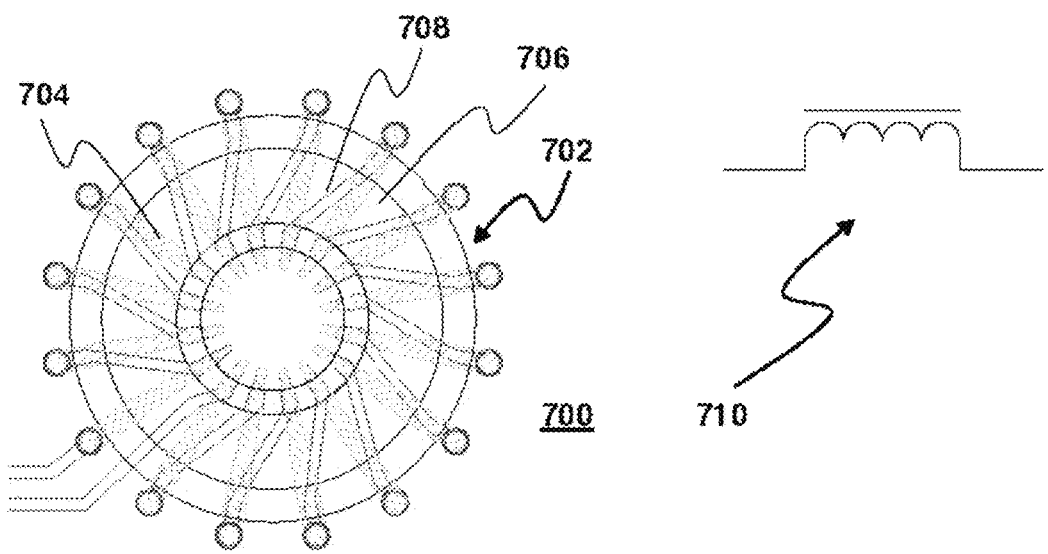
FIG. 7 illustrates a schematic of a magnetic component in accordance with another embodiment.

FIG. 7 illustrates a schematic of a magnetic component in accordance with another embodiment. In FIG. 7, magnetic component 700 may include a substrate (not shown) having a feature 702, a first conductive pattern 704, a permeability material 706, a substrate material (not shown), and a second conductive pattern 708. The first conductive pattern 704 and the second conductive pattern 708 cooperate to be capable of facilitating magnetic properties of the permeability material 706, and in this particular embodiment, magnetic component 700 may be capable of being utilized as a single inductor (i.e., an inductor type functionality) as shown by related circuit illustration 710.

Figure 8:
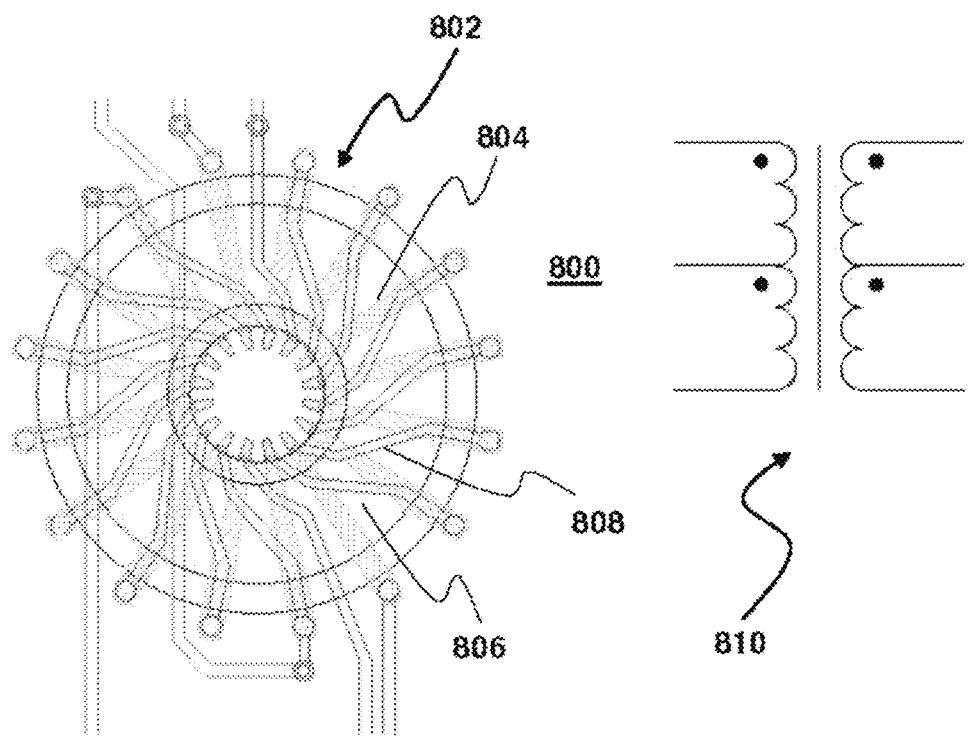
FIG. 8 illustrates a schematic of a magnetic component in accordance with another embodiment.

FIG. 8 illustrates a schematic of a magnetic component in accordance with another embodiment. In FIG. 8, magnetic component 800 may include a substrate (not shown) having a feature 802, a first conductive pattern 804, a permeability material 806, a substrate material (not shown), and a second conductive pattern 808. The first conductive pattern 804 and the second conductive pattern 808 cooperate to be capable of facilitating magnetic properties of the permeability material 806, and in this particular embodiment, magnetic component 800 may be capable of being utilized as an isolation transformer (i.e., a transformer type functionality) as shown by related circuit illustration 810.

Figure 9:
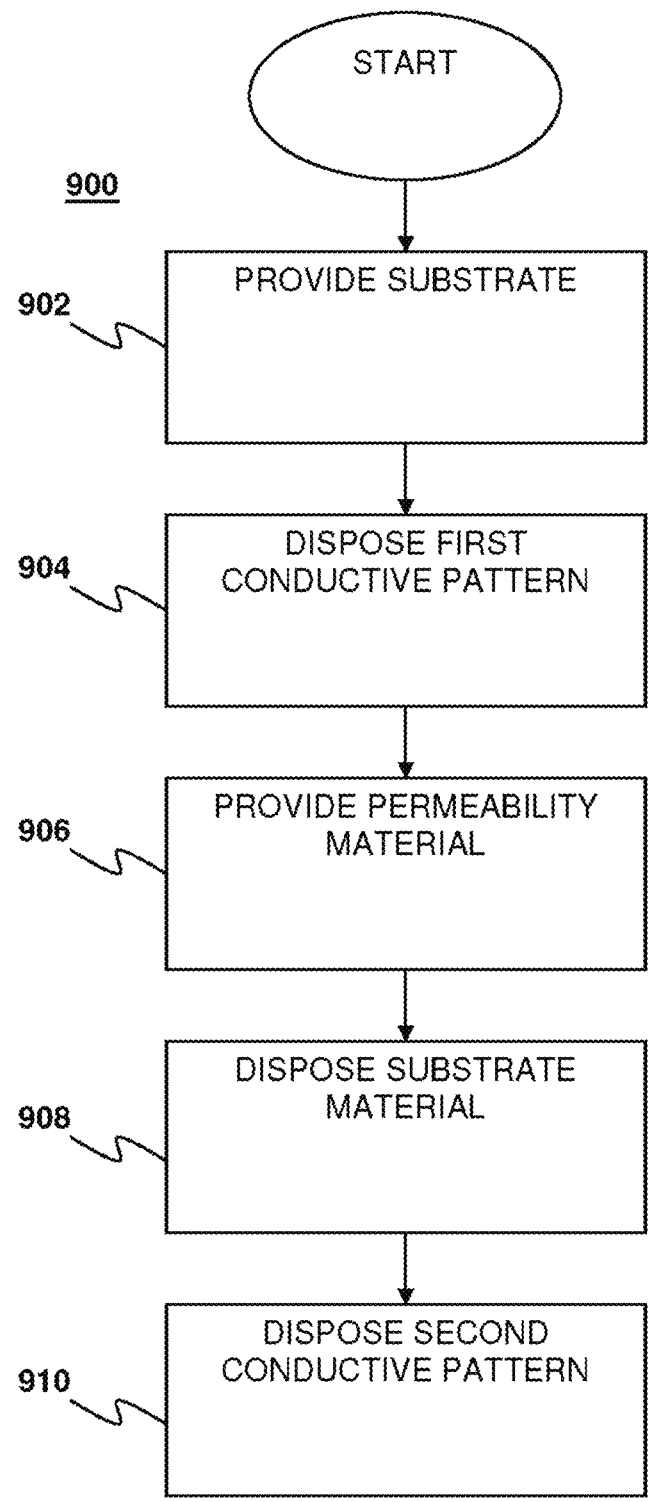
FIG. 9 illustrates a flow chart of one embodiment of a process for producing a magnetic component.

FIG. 9 illustrates a flow chart of one embodiment of a process for producing a magnetic component. As illustrated by flow chart 900 in FIG. 9, the process may start by providing a substrate, as indicated by block 902. As previously described, substrate may be of wide variety of materials that may be utilized to PCBs. Further, substrate may have a feature formed on the substrate utilizing a wide variety of approaches as previously described. In the embodiment of FIG. 9, a first conductive pattern may be disposed over the feature and the substrate, as indicated by block 904. At block 906, a permeability material may be disposed within the feature. A substrate material may be disposed over the permeability material and the substrate at block 908. At block 910, a second conductive pattern may be disposed on the substrate material, thereby facilitating a winding of the conductive patterns around the permeability material.

Gapping an Embedded Magnetic Device

Switch mode power conversion (SMPC) is widely used to implement high efficiency Alternating Current (AC)-to-Direct Current (DC) and DC-to-DC converters. Inductors and transformers are used in SMPC applications for energy storage and to filter switching noise. In most applications, the current in the inductive windings will have both an AC and DC component. Inductors are often implemented by winding a conductive coil around a ferromagnetic core. The amount of inductance is dependent on the number of windings and permeability of the core. When an electric current is applied to the windings, a magnetic field (H) will develop around the conductive windings and induce a magnetic flux (B) in the ferromagnetic core material. The H field is proportional to the driving current and the B field is proportional to the applied voltage. At low current and voltage levels, H and B have a linear relationship. Magnetic saturation occurs when excessive amounts of current are applied and the H field increases to the point where the relationship between H and B is no longer linear. When the core material saturates, the magnitude of the flux density, B, levels off and increasing the magnetic H field will not induce additional magnetic flux. If excessive current is driven into the core, it will saturate and not be able to sustain larger voltages. In the case of an output filter in a power converter, excessive DC current will cause ferromagnetic material to saturate, degrade the inductance, and change the filter performance characteristics.

Transformers are primarily intended to be used as AC devices. Switching the winding current in both a positive and negative direction will effectively switch the direction that the magnetic flux flows within the core material. If switched at high frequencies, the induced fluxes cancel out within each duty cycle. As noted earlier, however, the output of a power converter can have both AC and DC current components. DC current flowing through the output windings of the power transformer can saturate the ferromagnetic core and minimize its ability to store energy and filter noise.

For toroid (ring) shaped cores, designers often cut a gap (slot) out of the core (denoted herein as gapping) to extend its ability to handle DC currents. The gap effectively adds reluctance (resistance to the flow of magnetic flux) to the ferromagnetic core and reduces the sensitivity of the core to the driving current and the associated H field. The core permeability and inductance is reduced dramatically, yet the gapping allows the core to operate with much higher currents before saturation occurs. In the case of the power inductor, gapping allows the inductor to pass DC current to the load, while still serving as a filter to AC currents and high frequency switching noise.

Figure 10B:
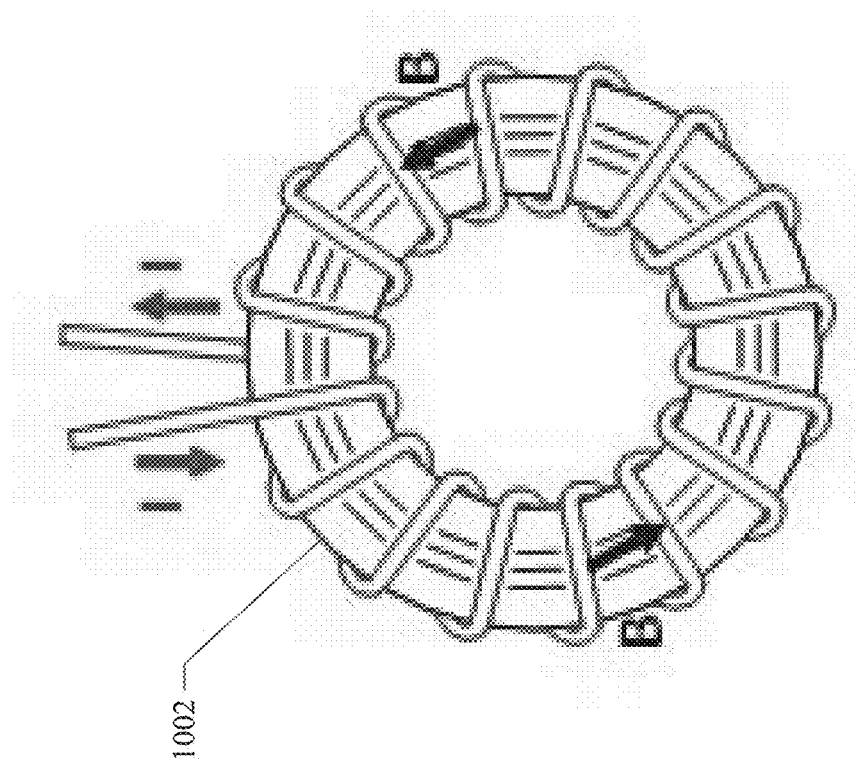
FIGS. 10a and 10b depict inductors wound on solenoid (FIG. 10a) and toroid (FIG. 10b) shaped cores.
Figure 10A:
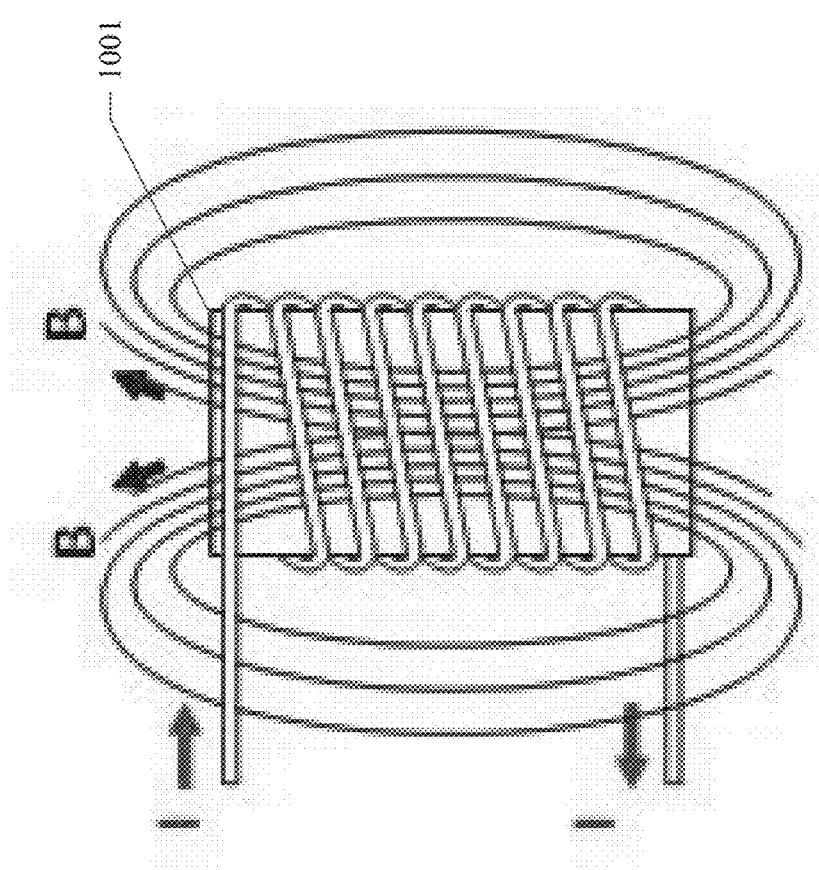

Inductors and transformers come in many shapes and sizes. FIGS. 10a and 10b depict inductors wound on solenoid 1001 (FIG. 10a) and toroid 1002 (FIG. 10b) shaped cores. In both FIGS. 10a and 10b, we see a depiction of the magnetic flux flowing in the two inductor shapes. Chip inductors and drum cores are widely used in electronic systems and are essentially wound on solenoid shaped cores. While chip inductors find widespread use, they are not the most efficient and can cause radiated and conducted noise problems due to the magnetic flux energy emanating from each end of the device. This radiated energy causes noise and can disturb nearby components. Given the same volume of ferromagnetic material, the toroid device 1002 (FIG. 10b)

is more efficient in that it will produce much more inductance per winding. Also, the toroid device 1002 (FIG. 10*b*) will exhibit lower power loss and noise emissions; because the magnetic flux, B, has a circular path within the high permeability ferromagnetic material and will remain contained within the core structure. The toroid core structure is preferred for controlling noise and maximizing the system efficiency.

Winding solenoids can be automated. Historically, it has been easier to manufacture inductors and transformers on solenoid bobbins rather than on toroid shaped cores. While there are automated winding machines designed to handle large toroid cores (<10 mm diameter), winding wire on a small toroid has defied automation. Plus, machining a gap into a small core requires precision fixtures to hold the core while it is being cut with either a diamond saw or laser. Once the core is gapped, the cut adds complications when applying the wire windings, whether it is wound manually or automatically.

An Example Embodiment for Gapping an Embedded Magnetic Device

Embedded magnetic construction gets around the challenges of gapping and winding. Rather than wind wire around the ring structure, the toroid cores in an example embodiment are embedded into a substrate and the windings are applied using standard Printed Circuit Board (PCB) processes. Multiple devices can be arrayed into a panel format and produced in an automated and batch process. Once the inductor or transformer is implemented in the PCB format, it can be easily handled on a machining station. In the case of mechanical gap cutting with a band saw, diamond wheel or cutting device, the panel can first be segmented into 1×N arrays of devices. In that smaller format, the 1×N arrays can be fastened to an x-y machining station and gaps can be cut into the edge of each device. If laser or water jet milling is employed, the panel array can be left intact and the cutting can be applied from either the top, bottom or both surfaces. Laser cutting is preferred in that it can provide narrow and precision gaps into the PCB and ferromagnetic core. The cutting section of the embedded magnetic device is a composite of the substrate material, encapsulation material and the ferromagnetic material. Each of these materials has different machining properties, so some test and experimentation is required to optimize the cut. With a laser, there are a number of variables that can be used to control the width and speed of the cut. These variables include, yet are not limited to; beam wavelength, beam power, beam width/aperture, beam pulse width (rate), and feed rate. The objective is to simply cut the gap into the ferromagnetic core. Yet, the cutting path should extend a small distance beyond the inner and outer radius of the ferromagnetic core, to compensate for any positioning tolerances.

FIGS. 11*a* and 11*b* show a top view and isometric view of an embedded magnetic device (e.g., inductor) 1100 in an example embodiment. The via arrays 1102 that interconnect the top and bottom layers can be positioned to provide clearance for the laser or cutting tool. The windings 1104 of the embedded magnetic device 1100 are imaged and etched onto the PCB panel. The cutting path 1106 can be marked with either an etched trace or printed with ink on the panel surface. Marking the path can help during the machine set-up and inspection after the cut has been completed. FIGS. 11*a* and 11*b* illustrate views of an embedded magnetic inductor 1100 in an example embodiment and the laser cutting path 1106 to perform gapping of the embedded magnetic inductor 1100.

The various embodiments disclosed herein are primarily described with toroid shaped core structures. However, the various embodiments disclosed herein also apply to other shapes of core structures. Other shapes can include an oval, rectangle, and multi-hole core structures. FIGS. 12*a* and 12*b* show top views of examples of embedded magnetic devices implemented on rectangular 1201 and multi-hole (binocular) 1202 core structures.

Figure 13:
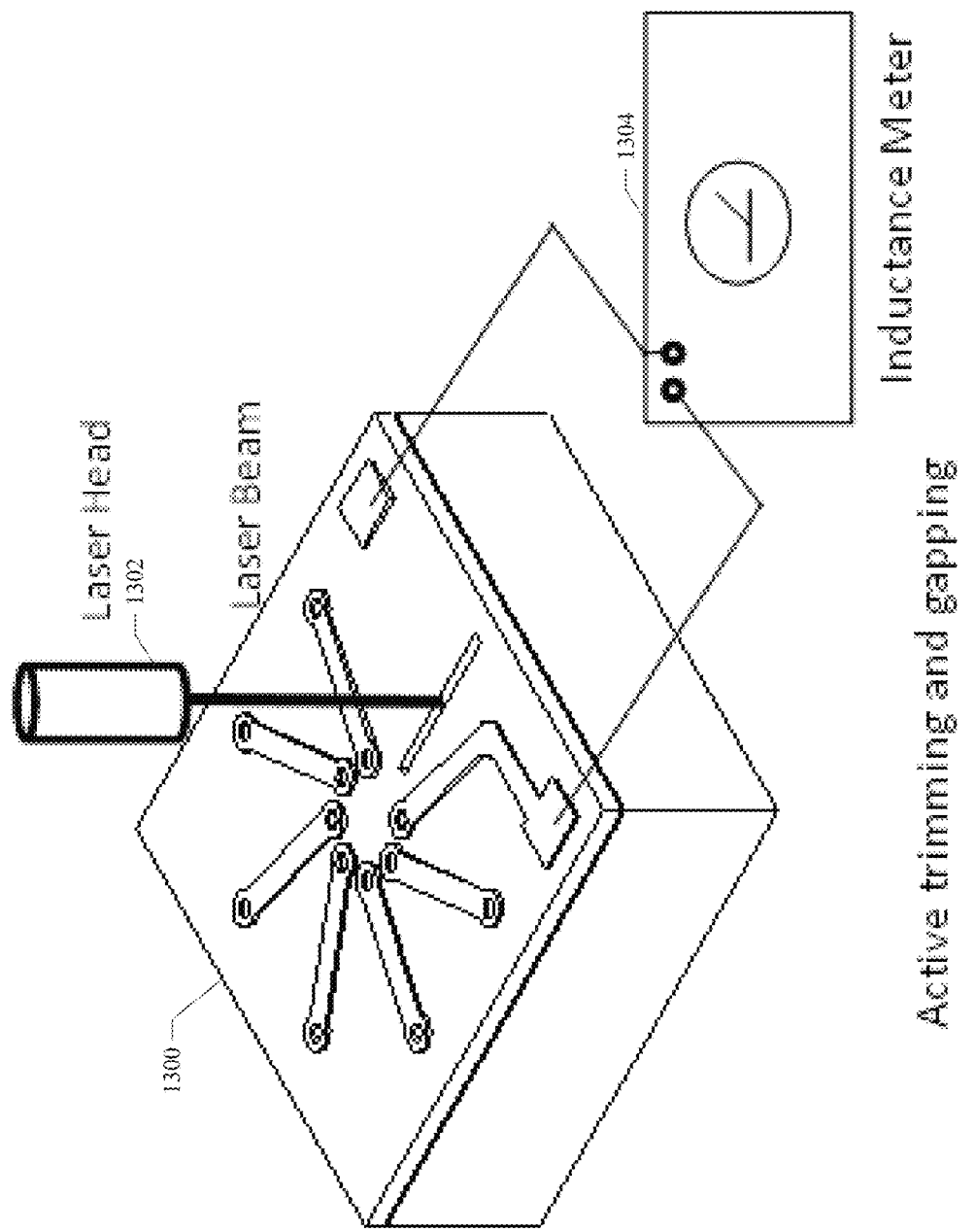
FIG. 13 shows an isometric diagram of an embedded magnetic device in an example embodiment being trimmed while the inductance is monitored by an inductance meter.

There may be some applications where it is not necessary to cut the ferromagnetic core all the way through. An example is when it is simply desired to trim or tune the inductance value. In this instance, the laser or cutting tool would only cut into a fraction of the width of the ferromagnetic core. Here, it is beneficial to monitor the inductance or other electrical characteristics of the embedded magnetic device during the cutting process and use the inductance value or other monitored electrical characteristics to control the cutting tool. FIG. 13 shows an isometric diagram of an embedded magnetic device 1300 in an example embodiment being trimmed with a laser 1302 while the inductance of the embedded magnetic device 1300 is monitored by an inductance meter 1304. As such, FIG. 13 illustrates an example embodiment of an active trimming and gapping system and method.

After the gap is applied, it may be beneficial to remove any debris from the gap. This can be achieved with forced air, forced water, forced solvent or by ultrasonic cleaning methods. Chemical and plasma etching may also be employed to remove debris from the gap. In most PCB applications, a solder mask or conformal coating is applied to the top and bottom surfaces to provide voltage isolation and environmental protection. For the same reasons, it is beneficial to fill or coat the applied gap. This can be achieved by filling or coating the gap with epoxy, polyimide or another gap filling material. The fill or coating material can be applied by spaying, painting, screen printing, sputtering, or other suitable method.

Many embedded magnetic inductive devices can be implemented with two printed circuit layers. There will be some instances where more layers are required. For a power transformer, it is useful to put the primary windings on the inner layers and secondary windings on outer layers. When more than two layers are applied, it is best to cut the gap before applying the outer layers. Prior to applying the outer layers, the gap can be filled with epoxy, polymer or other gap filling materials, as described above. An alternative is to simply leave the gap open and simply let the gap fill with epoxy during the lamination of the outer layers.

Figure 14:
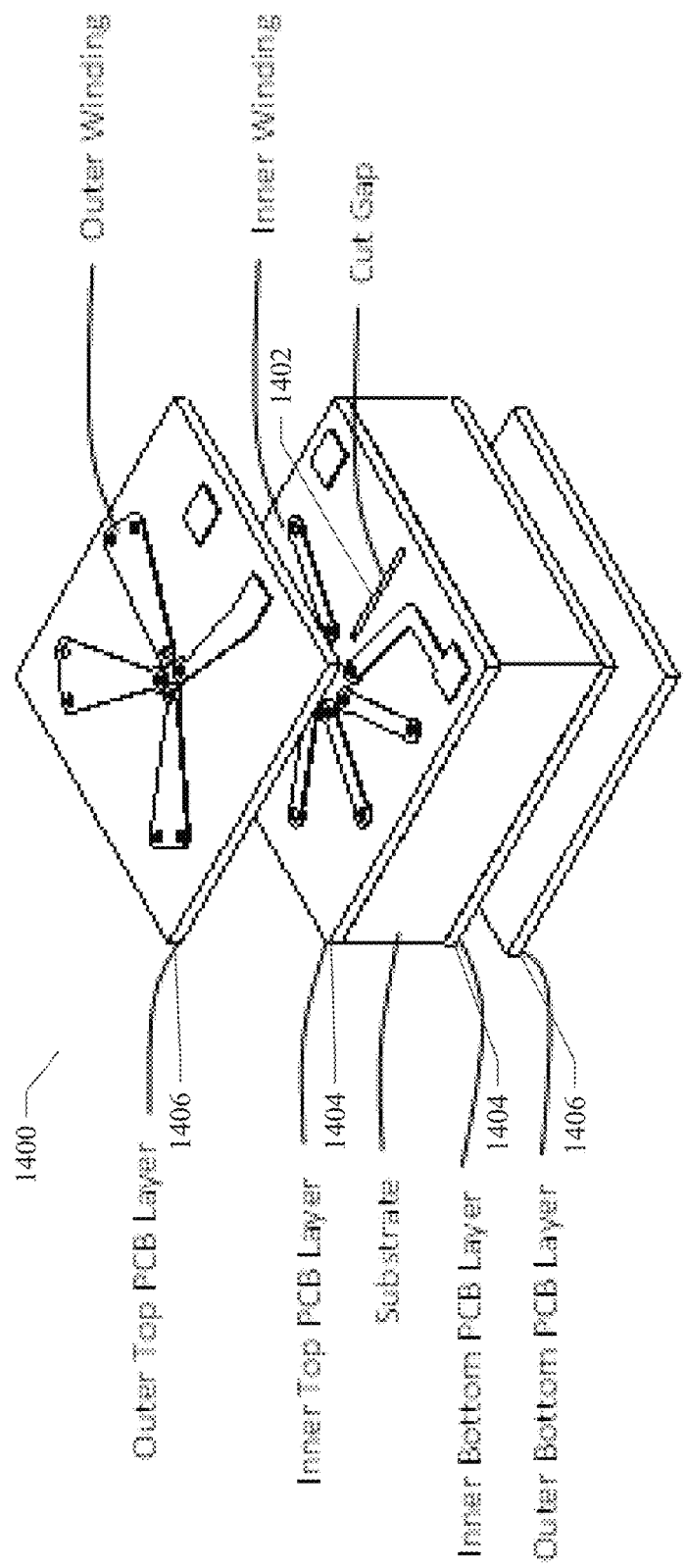
FIG. 14 depicts a four layer embedded magnetic device in an example embodiment where the gap is cut after application of the inner layer and covered by the outer layers.

FIG. 14 depicts a four layer embedded magnetic device 1400 in an example embodiment where the gap 1402 is cut in the inner layers 1404 after application of the inner layers 1404 and before the inner layers 1404 are covered by the outer layers 1406. For applications like a power converter, it is beneficial to have the power inductor or transformer integrated into the PCB format, upon which other active and passive devices can be placed to produce a subsystem module. In these applications, the gapping process provided by the various example embodiments described herein can be used to gap the embedded magnetic device while enabling integration of the gapped embedded magnetic device with other active and passive devices on a PCB substrate.

Figure 15B:
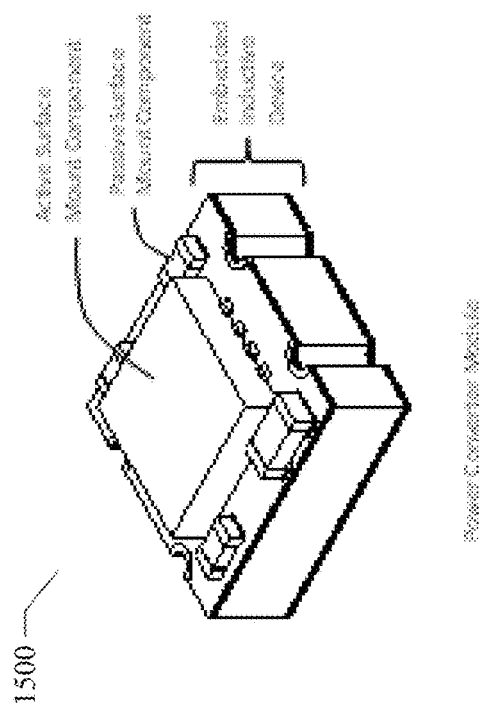
FIGS. 15a and 15b depict how a power converter module in an example embodiment can be implemented with embedded magnetics.
Figure 15A:
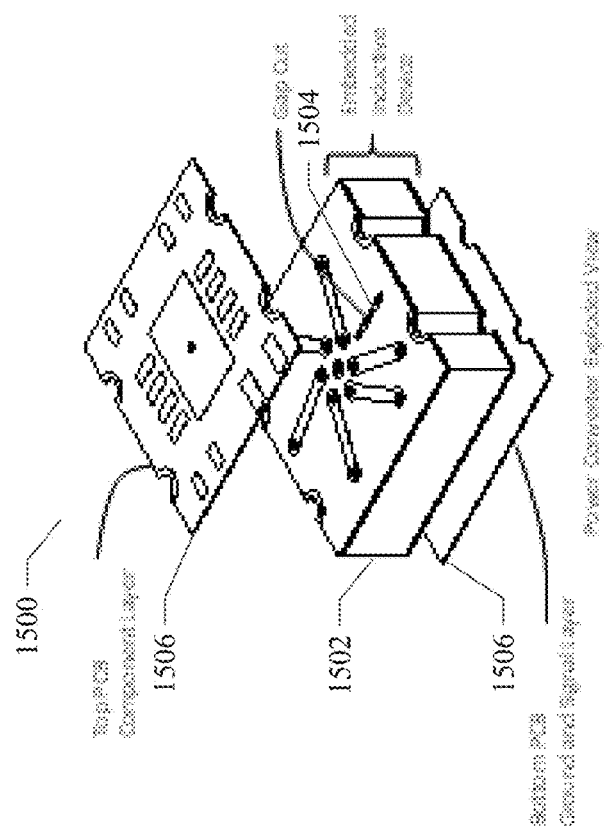

FIGS. 15*a* and 15*b* depict how a power converter module 1500 in an example embodiment can be implemented with embedded magnetics. The power inductor is often the largest component in the circuit. Embedding the power inductor into the PCB substrate can greatly reduce the size of the module. Similar to the four layer transformer of the example embodiment described above, the gapped embedded magnetic device 1502 can be implemented in the underlying layers. The gap 1504 can either be cut and filled prior to applying the outer layers 1506 or cut and filled with epoxy during the lamination process. FIGS. 15*a* and 15*b* illustrate an example embodiment of a power converter 1500 constructed with an embedded magnetic device 1502, wherein the gapping process provided by the various example embodiments described herein can be used to gap the embedded magnetic device 1502 while enabling integration of the gapped embedded magnetic device 1502 with a power converter on a PCB substrate.

Figure 16C:
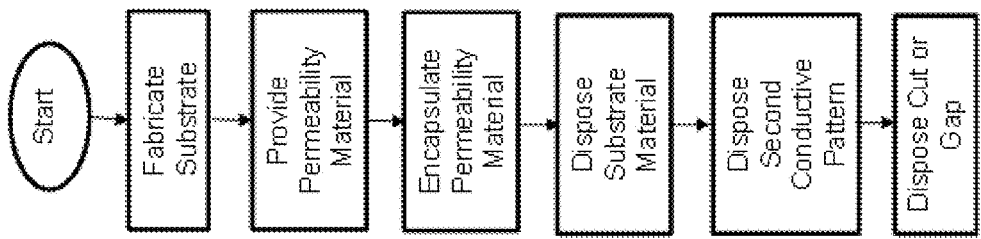
FIGS. 16a, 16b, and 16c depict variations of example embodiments where the trim-cut or gap can be applied during the device fabrication.
Figure 16B:
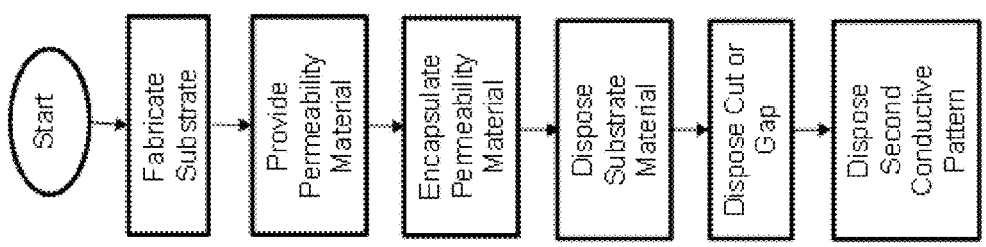
Figure 16A:
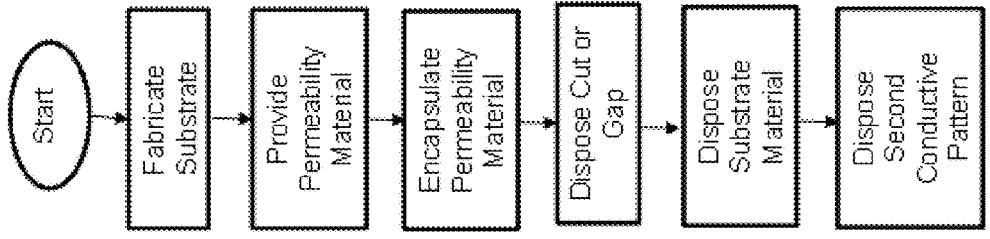

In various example embodiments, the gap can be applied at different stages of the fabrication process flow. For mechanical gapping, it is typically best to machine the gap after the device fabrication is complete. For laser, water jet, or plasma gapping, the gap can be applied at various stages of the fabrication process. FIGS. 16*a*, 16*b*, and 16*c* depict variations of different stages of the fabrication process flow of example embodiments where the trim-cut or gap can be applied during various stages of the device fabrication process.

FIG. 17 is a flow chart illustrating an example embodiment of a method 1700 as described herein. The method 1700 of the example embodiment comprises: forming a feature on a substrate, the feature being a depression defining an inside surface (operation 1710); disposing a first conductive pattern on the substrate and the inside surface of the feature (operation 1720); disposing a permeability material on the inside surface of the feature and the first conductive pattern (operation 1730); disposing a substrate material on the substrate and the feature (operation 1740); disposing a second conductive pattern on the substrate material, the second conductive pattern substantially matching the first conductive pattern to wrap the permeability material between the first conductive pattern and the second conductive pattern producing a winding type structure electrically coupling the first conductive pattern and the second conductive pattern in electrical connection to define at least one electrical circuit to facilitate a magnetic field in the permeability material (operation 1750); and gapping the permeability material to remove at least a portion of the permeability material to produce a gap in the at least a portion of the permeability material (operation 1760).

While there has been illustrated and/or described what are presently considered to be example embodiments of claimed subject matter, it will be understood by those of ordinary skill in the art that various other modifications may be made, and/or equivalents may be substituted, without departing from the true scope of claimed subject matter. Additionally, many modifications may be made to adapt a particular situation to the teachings of claimed subject matter without departing from subject matter that is claimed. Therefore, it is intended that the patent not be limited to the particular embodiments disclosed, but that it covers all embodiments falling within the scope of the appended claims.

What is claimed is:

1. A method comprising:
  forming a feature on a substrate, the feature being a depression defining an inside surface;
  disposing a first conductive pattern on the substrate and the inside surface of the feature;
  disposing a permeability material on the inside surface of the feature and the first conductive pattern, the permeability material being a separate solid object placed within the feature;
  disposing a substrate material on the substrate and the feature;
  disposing a second conductive pattern on the substrate material, the second conductive pattern substantially matching the first conductive pattern to wrap the permeability material between the first conductive pattern and the second conductive pattern producing a winding type structure electrically coupling the first conductive pattern and the second conductive pattern in electrical connection to define at least one electrical circuit to facilitate a magnetic field in the permeability material; and
  gapping the permeability material, after the permeability material has been disposed on the inside surface of the feature on the substrate, to remove at least a portion of the permeability material to produce a gap in the at least a portion of the permeability material.

2. The method of claim 1, wherein electrically coupling the first and second conductive patterns comprises electrically coupling the first conductive pattern and the second conductive pattern to define at least two interleaved electrical paths to produce a single common mode filter type functionality.

3. The method of claim 1, wherein electrically coupling the first and second conductive patterns comprises electrically coupling the first conductive pattern and the second conductive pattern to define at least four interleaved electrical paths to produce a dual common mode filter type functionality.

4. The method of claim 1, wherein electrically coupling the first and second conductive patterns comprises electrically coupling the first conductive pattern and the second conductive pattern to define at least two interleaved electrical paths to produce a single inductor type functionality.

5. The method of claim 4, further including embedding a power conductor into the substrate after gapping the permeability material.

6. The method of claim 1, wherein electrically coupling the first and second conductive patterns comprises electrically coupling the first conductive pattern and the second conductive pattern to define at least two interleaved electrical paths to produce a transformer type functionality.

7. The method of claim 6, further including embedding a power conductor into the substrate after gapping the permeability material.

8. The method of claim 1, wherein gapping the permeability material includes using a saw or other mechanical cutting tool to remove the at least a portion of the permeability material.

9. The method of claim 1, wherein gapping the permeability material includes using a laser to remove the at least a portion of the permeability material.

10. The method of claim 1, wherein gapping the permeability material includes using a water jet, plasma, or other non-mechanical cutting tool to remove the at least a portion of the permeability material.

11. The method of claim 1, further including monitoring electrical characteristics of the at least one electrical circuit while gapping the permeability material.

12. The method of claim 1, further including monitoring electrical characteristics of the at least one electrical circuit while gapping the permeability material and using the monitored electrical characteristics to control the gapping.

13. The method of claim 1, further including removing debris from the gap in the at least a portion of the permeability material.

14. The method of claim 1, further including filling or coating the gap with a gap filling material.

15. The method of claim 1, further including applying at least one outer layer to the substrate after gapping the permeability material.

16. The method of claim 1, further including embedding a power conductor into the substrate after gapping the permeability material.

* * * * *